March 18, 1969 DAVID C. CHU ET AL 3,434,065

AUTOMATIC-GAIN-CONTROLLED AMPLIFIER HAVING A LEVEL INDICATOR

Filed March 17, 1967

INVENTORS
DAVID C. CHU
LEE-SEN TING

BY Roland I. Griffin
ATTORNEY

United States Patent Office 3,434,065

Patented Mar. 18, 1969

3,434,065

AUTOMATIC-GAIN-CONTROLLED AMPLIFIER HAVING A LEVEL INDICATOR

David C. Chu, Menlo Park, and Lee-Sen Ting, Mountain View, Calif., assignors to Hewlett-Packard Company, Palo Alto, Calif., a corporation of California Filed Mar. 17, 1967, Ser. No. 624,006

U.S. Cl. 330—2 5 Claims

Int. Cl. G01r *19/10, 21/00, 23/00*

ABSTRACT OF THE DISCLOSURE

An amplifier employing automatic gain control (AGC) to prevent its output signal level from increasing further when the upper limit of its dynamic operating range is reached and to provide an analog output indication that varies substantially linearly with its input signal level both above and below the upper limit of its dynamic operating range.

*Background of the invention*

This invention relates to an automatic-gain-controlled amplifier employing the sum of the AGC signal level and the output signal level of the amplifier to provide an analog output indication that varies substantially linearly with the input signal level.

An amplifier has a dynamic operating range 10 over which its output signal level varies substantially linearly with its input signal level as shown in FIGURE 1(*a*). When the amplifier is operated above the upper limit of its dynamic operating range 10, its output signal level varies nonlinearly with its input signal level because of distortion and other nonlinear effects. This is indicated by the dashed line 12 shown in FIGURE 1(*a*). Maximum utilization of the dynamic operating range 10 of the amplifier may be obtained by employing an AGC feedback circuit to prevent its output signal level from increasing further when the upper limit of its dynamic operating range is reached. The AGC feedback circuit is activated only when the upper limit of the dynamic operating range 10 is reached so that there is no loss of gain. This presents a problem, however, in amplifiers employing a level indicator to provide an analog output indication that varies linearly with the input signal level. The level indicator is driven by the output signal level of the amplifier. Thus, the analog output indication remains constant and therefore varies nonlinearly with any further increases in the input signal level when the AGC feedback circuit is activated. This prevents the level indicator peaking required in many applications.

*Summary of the invention*

Accordingly, it is the principal object of this invention to maximize utilization of the dynamc operatng range of an amplfier without loss of gain and still provide an analog output indication that varies substantially linearly with the input signal level both above and below the upper limit of the dynamic operating range of the amplifier.

This object is accomplished according to the illustrated embodiment of this invention by providing an automatic-gain-controlled amplifier in which the AGC is activated only when substantially the upper limit of the dynamic operating range of the amplifier is reached. A summing circuit is employed for driving a level indicator with a signal level related to the sum of the output signal level of the amplifier and the AGC signal level to provide an analog output indication that varies substantially linearly with the input signal level both above and below the upper limit of the dynamic operating range of the amplifier.

*Description of the preferred embodiment*

Figure 2:
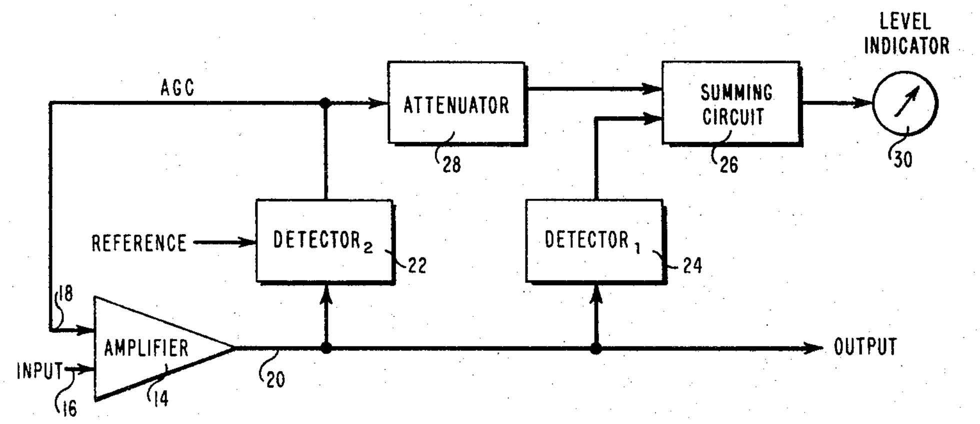
FIGURE 2 is a block diagram of an amplifier according to this one embodiment of this invention.

Referring now to FIGURE 2, there is shown an amplifier 14 having a signal input 16, a control input 18, and a signal output 20. An AGC feedback circuit is connected between the signal output and the control input 18 to prevent the output signal level of the amplifier 14 from increasing further when it reaches substantially the upper limit of the dynamic operating range of the amplifier. This AGC feedback circuit comprises a detector 22 that is activated to supply an AGC signal to the amplifier 14 only when the output signal level of the amplifier reaches the level of a reference signal applied to the detector 22. The reference signal is adjusted so that this occurs substantially at the upper limit of the dynamic operating range of the amplifier 14 to maximize utilization of the dynamic operating range without less of gain.

Another detector 24 is connected between the signal output 20 and one input of a summing circuit 26 to supply the output signal level of the amplifier 14 to the summing circuit. The output of detector 22 is connected by an attenuator 28 (or an amplifier) to another input of the summing circuit 26 to supply a scaled AGC signal level to the summing circuit. Each of the detectors 22 and 24 comprises a rectifier stage for rectifying the output signal of the amplifier 14 and an amplifier stage for amplifying the resultant DC signal level. The summing circuit 26 is connected to a DC level indicator 30 for supplying the DC sum of the output signal level of the amplifier 14 and the scaled AGC signal level to the level indicator.

Figure 1:
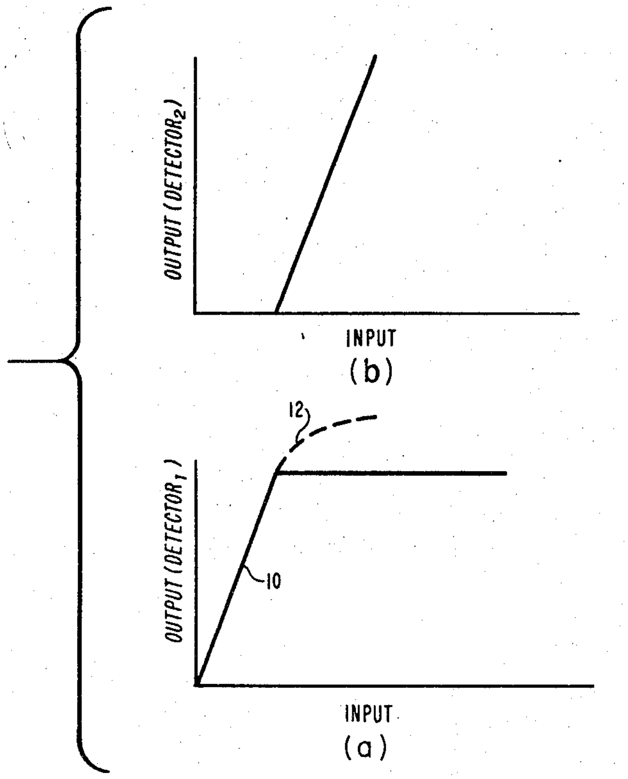
FIGURE 1(*a*), already referred to above, and FIGURE 1(*b*) are simplified plots of the output signal level and the AGC signal level versus the input signal level for an amplifier according to one embodiment of this invention.

As shown in FIGURE 1(*a*), the output signal varies substantially linearly with the input signal level throughout the dynamic operating range of the amplifier 14 and remains substantially constant thereafter when the AGC feedback circuit is activated. Conversely, as shown in FIGURE 1(*b*), the AGC signal level is zero throughout the dynamic operating range of the amplifier 14 and varies substantially linearly with the input signal level thereafter when the AGC feedback circuit is activated. By appropriate adjustment of the attenuator 28 (or of an amplifier that may be required in its place) the curve of FIGURE 1(*b*) may be substantially aligned with the curve of FIGURE 1(*a*). An analog output indication that varies substantially linearly with the input signal level both above and below the upper limit of the dynamic operating range of the amplifier 14 is therefore provided by the DC level indicator 30. This permits peaking of the DC level indicator as required in many applications.

We claim:

1. An amplifying circuit comprising:

an amplifier having an input and an output, said amplifier having a dynamic operating range where its output signal varies substantially linearly with its input signal;

a feedback circuit electrically connected between the output and the input of the amplifier for supplying a feedback signal to the amplifier to prevent its output signal from increasing further when its output signal reaches substantially the upper limit of the dynamic operating range of the amplifier;

an indicator for providing an output indication that varies with the input signal of the amplifier; and means electrically connecting the output of the amplifier and the feedback circuit to the indicator for supplying a signal related to the sum of the output signal of the amplifier and the feedback signal to the indicator to make it vary substantially linearly with the input signal of the amplifier both above and below the upper limit of the dynamic operating range of the amplifier.

2. An amplifying circuit as in claim 1 wherein said means comprises:

a summing circuit; and circuit means electrically connecting the output of the amplifier and the feedback circuit to the summing circuit for supplying the output signal of the amplifier and the feedback signal to the summing circuit;

said summing circuit being electrically connected to the indicator for supplying a signal related to the sum of the output signal of the amplifier and the feedback signal to the indicator.

3. An amplifying circuit as in claim 2 wherein:

said feedback circuit includes a first detector having an output connected to the input of the amplifier, said detector being activated to supply a feedback signal level related to the output signal of the amplifier to the input of the amplifier when the output signal of the amplifier reaches substantially the upper limit of the dynamic operating range of the amplifier; and said circuit means includes a second detector connected between the output of the amplifier and the summing circuit for supplying a signal level related to the output signal of the amplifier to the summing circuit.

4. An amplifying circuit as in claim 3 wherein said circuit means includes a device connected between the output of the first detector and the summing circuit for scaling the feedback signal level supplied to the summing circuit.

5. An amplifying circuit as in claim 4 wherein said device comprises an attenuator for attenuating the feedback signal level supplied to the summing circuit.

References Cited

UNITED STATES PATENTS

| | | | |
|---|---|---|---|
| 2,783,466 | 2/1957 | Dunn | 330—2 X |
| 3,187,265 | 6/1965 | Hermes | 330—2 |

NATHAN KAUFMAN, *Primary Examiner.*

U.S. Cl. X.R.

325—389; 330—127